(12) United States Patent
Sarwary et al.

(10) Patent No.: US 7,536,662 B2
(45) Date of Patent: May 19, 2009

(54) METHOD FOR RECOGNIZING AND VERIFYING FIFO STRUCTURES IN INTEGRATED CIRCUIT DESIGNS

(75) Inventors: Shaker Sarwary, San Diego, CA (US); Jun Yuan, San Jose, CA (US); Bernard Murphy, Tuolumne, CA (US); Ashish Hari, Delhi (IN); Paras Mal Jain, Alwar (IN)

(73) Assignee: Atrenta, Inc., San Jose, CA (US)

( * ) Notice: Subject to any disclaimer, the term of this patent is extended or adjusted under 35 U.S.C. 154(b) by 284 days.

(21) Appl. No.: 11/426,936

(22) Filed: Jun. 27, 2006

(65) Prior Publication Data

US 2008/0008021 A1   Jan. 10, 2008

(51) Int. Cl.
*G06F 17/50* (2006.01)
(52) U.S. Cl. .............................. 716/5; 716/4
(58) Field of Classification Search .................. 716/4–5
See application file for complete search history.

(56) References Cited

U.S. PATENT DOCUMENTS

| | | | |
|---|---|---|---|
| 5,153,509 A | 10/1992 | Dalrymple et al. | |
| 5,968,134 A * | 10/1999 | Putzolu et al. | 709/238 |
| 6,757,854 B1 | 6/2004 | Zhao et al. | |
| 7,263,675 B2 * | 8/2007 | Dargelas | 716/4 |
| 2002/0162046 A1 | 10/2002 | Krech, Jr. et al. | |
| 2004/0240482 A1 | 12/2004 | Huang | |
| 2005/0086462 A1 * | 4/2005 | Vorbach | 713/100 |

* cited by examiner

*Primary Examiner*—Vuthe Siek
(74) *Attorney, Agent, or Firm*—Sughrue Mion, PLLC

(57) ABSTRACT

First-in-first-out (FIFO) structures are recognized and verified in integrated circuit (IC) designs. The FIFO recognition is based on structural analysis of the design. Specifically, the structural analysis includes performing seed based recognition by identifying logic elements that indicate the existence of candidate FIFO circuitry and then exploring the candidate circuitry to completely verify the presence of a FIFO structure. Recognized FIFOs may be verified to ensure the proper generation of the full and empty flags.

17 Claims, 7 Drawing Sheets

METHOD FOR RECOGNIZING AND VERIFYING FIFO STRUCTURES IN INTEGRATED CIRCUIT DESIGNS

TECHNICAL FIELD

The present invention relates generally to the verification of integrated circuit (IC) designs, and more particularly to a method for identification and verification of first-in-first-out (FIFO) elements in an IC design.

BACKGROUND OF THE INVENTION

Fast, efficient and reliable testing is an important step in the design of ICs. Testing the overall design is typically performed by verifying the proper operation of certain logic structures of the IC. One of the logic structures that is considered to be difficult for verification is a FIFO element.

FIFOs are used commonly in ICs for buffering and flow control. In hardware form, a FIFO consists of a set of read and write pointers, storage and control logic. The storage may be RAM, flip-flops, latches or any other suitable form of storage. For FIFOs of non-trivial size, a dual-port SRAM is usually used where one port is used for writing and the other is used for reading. The write pointer holds the write address of the storage cell into which data should be written during the next write operation, and a read pointer holds the read address of the storage cell from which data should be read during the next read operation. The control logic generates the FIFO status flags that include full, empty, almost full, or almost empty. When the full flag is raised, no data can be written into the FIFO, and once the empty flag is raised no data can read from the FIFO.

There are two types of FIFOs in the related art: synchronous and asynchronous. A synchronous FIFO is a FIFO where the same clock is used for both reading and writing. An asynchronous FIFO uses different clocks for reading and writing. Asynchronous FIFOs introduce metastability issues, and thus a typical asynchronous FIFO implements a Gray code (or any other unit distance code) for the read and write pointers to ensure reliable flag generation.

Many defects and faults may be encountered during the operation of the FIFO structure due to a faulty design. The faults are generally classified as memory faults, control faults, and read and write logic faults. To detect these faults the FIFOs are tested during the design of an IC. In the related art, the FIFO tests are generally performed by simulating test vectors and explicit assertions of the status flags. Vector simulations comprise writing vectors to the FIFO being tested and reading vectors that are expected in response. Flag assertions tests include, for example, asserting the full flag and trying to write to the FIFO's memory. If the write succeeds then a FIFO fault is detected.

The prior art FIFO testing techniques require the user's intervention in specifying all FIFO structures that exist in the design. Moreover, such techniques require the user to specify, for each under-test FIFO, its structure and elements. In typical ICs, where the number of FIFO structures may be large, this is an inefficient and time-consuming task as well as being error prone.

Therefore, in the view of the limitations mentioned above, it would be advantageous to provide an efficient solution that would automatically recognize and verify FIFOs in IC designs.

SUMMARY OF THE INVENTION

The present invention provides a method for the automatic, computer-implemented recognition and verification of FIFO structures in IC designs.

One aspect of the invention allows a user to define a type of recognition seed to be used, for example, a synchronizer-seed based recognition or a memory-seed based recognition, and the order in which the recognition seed should be used. If a synchronizer-seed based recognition is selected, standard multi flip-flop structures are searched in the design. The logic structures in the IC design that match the logic structure of the selected seed is recognized. The region around each identified logic structure is explored to achieve full FIFO recognition. For any recognized FIFO, the FIFO read and write pointers are identified, and verification of the recognized FIFO is done by comparing the read and write pointers to determine if the FIFO memory is full or empty.

In another aspect of the invention, the memory-seed based recognition method identifies all memory units in the IC design, and, for each identified memory unit, traversing forward from the memory until a read pointer is encountered, and traversing backward from the memory unit until a write pointer is encountered. Traversals are then made from the read and write pointers until incremental operators are identified, and the circuitry around the selected memory-seed is determined to be a FIFO.

In yet another aspect of the invention, FIFOs in the design can be recognized by using counter-seed based detection, where the recognition process traces back from incremental operators that are potential counters of read and write pointers of the FIFO until encountering a memory unit or a control unit of the FIFO. If the read and write pointers or empty and full flags are identified, the FIFO is recognized.

DETAILED DESCRIPTION OF THE INVENTION

Figure 1:
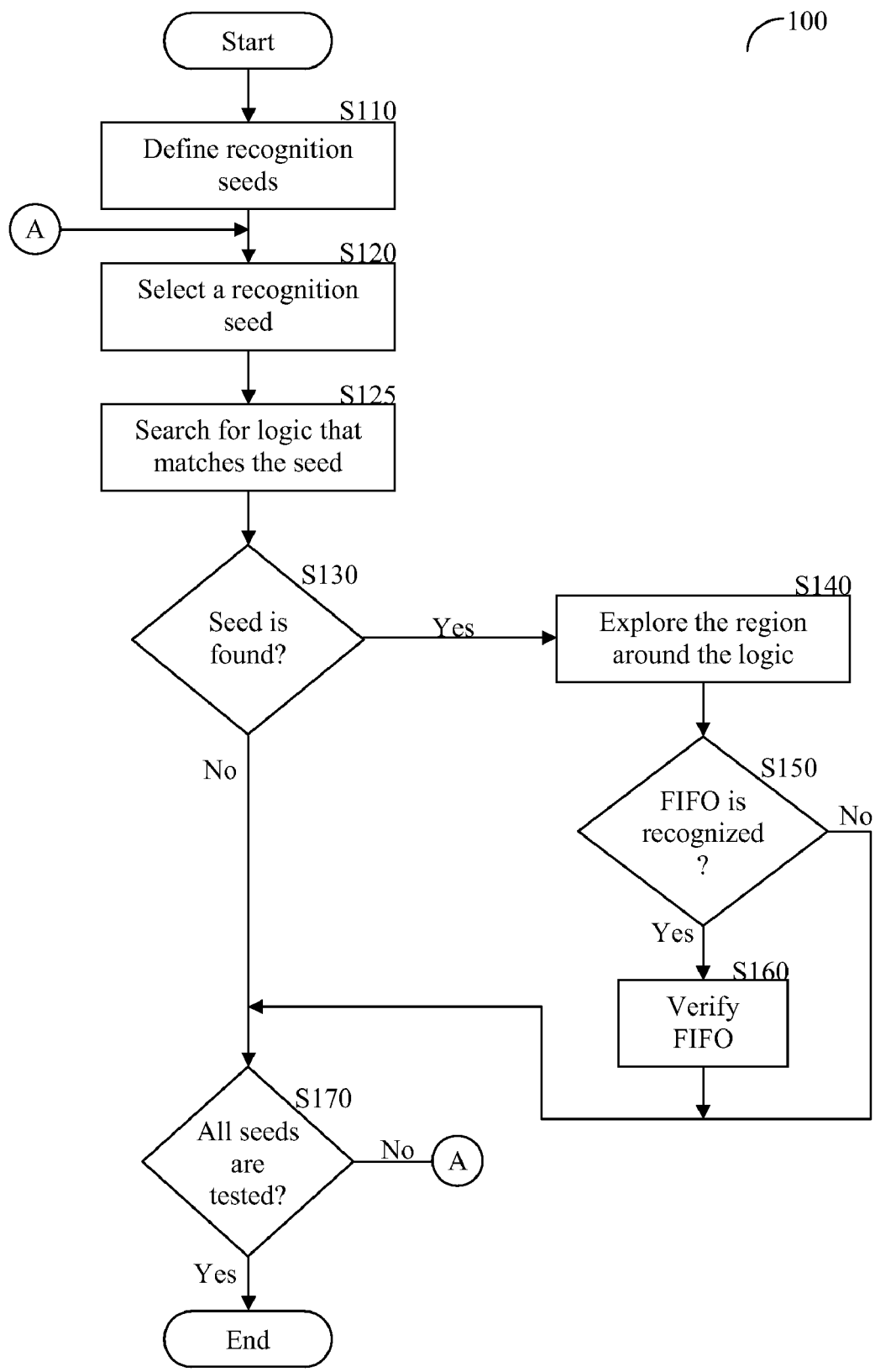
FIG. 1 is a flowchart describing the method for recognition and verification of FIFO structures in IC designs in accordance with an exemplary embodiment of the present invention.

The invention will now be taught using various exemplary embodiments. Although the embodiments are described in detail, it will be appreciated that the invention is not limited to just these embodiments, but has a scope that is significantly broader. The appended claims should be consulted to determine the true scope of the invention FIG. 1 shows an exemplary and non-limiting flowchart 100 describing the method for automatic recognition and verification of first-in-first-out (FIFO) structures in integrated circuit (IC) designs. The FIFO recognition is based on structural analysis of the design. At S110, the user defines one or more recognition seeds to be used in the recognition process. A recognition seed is a logic element included in a FIFO and may indicate a potential FIFO circuitry in the design. The recognition seed may be, but is not limited to, a memory unit, a synchronizer, an equal operator, a less-than (LT) operator, a less-than-or-equal (LTE) operator, a greater-than (GT) operator, or greater-than-or-equal (GTE) operator, and so on. The utilization of a synchronizer seed and a memory seed to recognize FIFO structures are described in greater detail below. The user may also specify which recognition seeds may be used in certain areas of the design. For example, the user may define that in some areas of the design only the synchronizer-seed based recognition is used, and in other areas, the memory-seed based recognition should be used. In addition, the user may define the order in which the recognition seeds should be used in the recognition process.

At S120, one of the recognition seeds defined by the user is selected. Subsequently, at S125, the method tries to recognize logic structures in the design that match the logic structure of the selected seed. For example, if a synchronizer-seed is selected, standard multi flip-flop structures may be searched in the design. At S130, a check is made to determine if one or more logic structures matching the seed are identified. If so, at S140, the region around each identified logic structure is explored to achieve full FIFO recognition. An approach to FIFO recognition may include identifying read and write pointers, regardless of the initial seed. At S150, a check is made to determine if the read and write pointers are identified, and, if so, the structure is considered a recognized FIFO, and execution continues with S160 where the recognized FIFO is verified. The verification is described in greater detail below. If S130 results with a negative answer, i.e., the seed was not found, execution proceeds to S170 where it is checked whether all recognition seeds were tested. If so, execution ends, otherwise, the process returns to S120.

Figure 2:
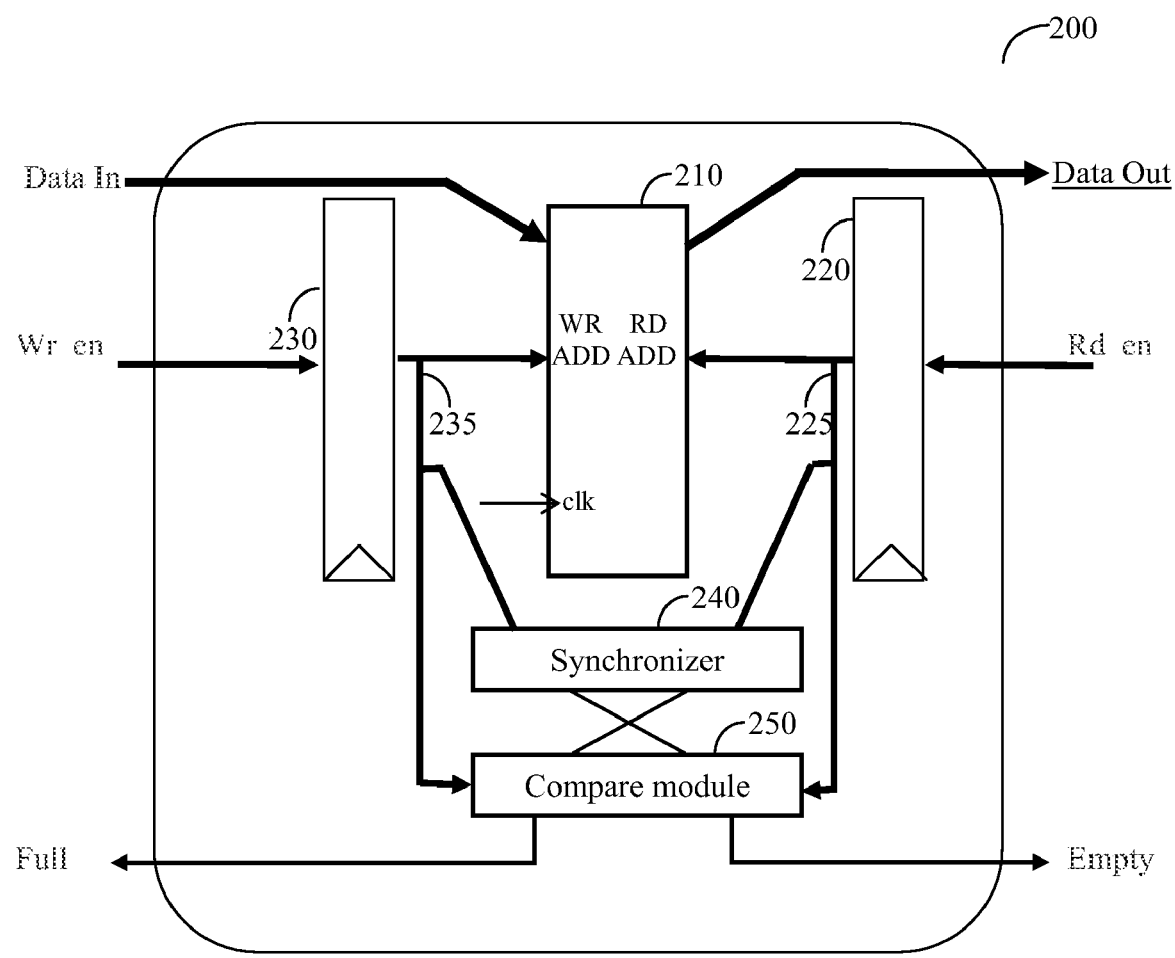
FIG. 2 is a diagram of an asynchronous FIFO used for describing the principles of the synchronizer-seed based FIFO recognition technique.

FIG. 2 shows a non-limiting and exemplary diagram of an asynchronous FIFO 200 used for describing the principles of the synchronization-seed based FIFO recognition technique. In the asynchronous FIFO, data is written sequentially into a FIFO memory using one clock domain, and the data is sequentially read from the same FIFO memory using another clock domain. The two clock domains are asynchronous to each other. That is, asynchronous FIFOs are generally placed at clock domain crossings. A general structure of asynchronous FIFO 200 includes a memory unit 210, read and write counters 220 and 230 respectively, a synchronizer 240, and a compare module 250.

FIFO memory 210 is accessed by both the write and read clock domains. FIFO memory 210 may be instantiated or inferred as a synchronous or asynchronous dual-port RAM. Other memory types can be adapted to function as the FIFO memory. FIFO memory 210 includes a Data In bus, a Write Address bus, and a Read Address bus that serves as inputs and an output Data Out bus. The Read Address and Write Address have the same width.

Read and write counters 220 and 230 count up to the size (i.e., number of words) of FIFO memory 210. The output of read counter 220 is a read pointer (RPTR) 225 and the output of write counter 230 is a write pointer (WPTR) 235. Both pointers are Gray-encoded. Specifically, in the read domain, counter 220 is Gray decoded and, in the write domain, counter 230 is Gray encoded. In the asynchronous FIFO 200, pointers 225 and 235 are synchronized by synchronizer 240 into the opposite clock domain before generating the FIFO flags. That is, when comparing the read and write pointers for asserting the empty flag, read counter 220 is synchronized and then is compared with write counter 230. Similarly, when generating the full flag in the write domain. Typically, synchronizer 240 is structured as a standard multi flip-flop meta-stability structure.

Compare module 250 compares between the read and write pointers 225 and 235 to determine if FIFO memory 210 is full or empty. If read pointer 225 equals to write pointer 235 there is no data to read from memory 210, and thus the empty flag is set. Note that both counters initialize to zero after reset. If write pointer 235 minus read pointer 225 equals the number of words in memory 210, the full flag is set. Compare module 250 contains only combinational comparison logic including at least an equal operator and at least one of less-than (LT), less-than-or-equal (LTE), greater-than (GT), or greater-than-or-equal (GTE) operator.

Figure 3:
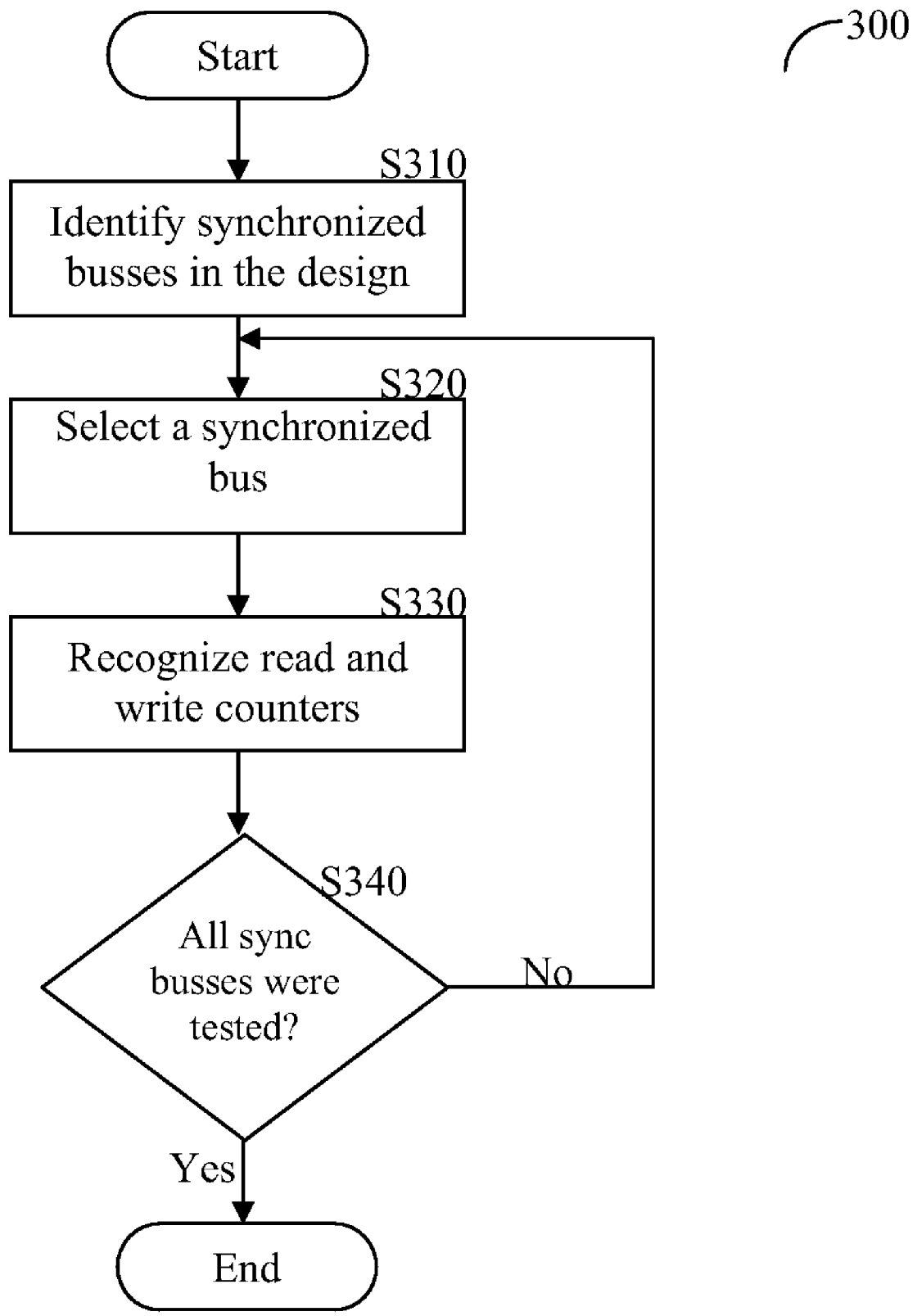
FIG. 3 is a flowchart describing the method of synchronizer-seed based recognition in accordance with an exemplary embodiment of the present invention.

FIG. 3 shows a non-limiting and exemplary flowchart describing the method of synchronizer-seed based recognition in accordance with an exemplary embodiment of the present invention. The synchronizer-seed based recognition approach includes identifying a synchronizer that indicates FIFO circuitry and then exploring the circuitry for full FIFO recognition. The synchronization-seed approach does not require memory recognition and detects both empty and full flags. At S310, all address buses in the design that are synchronized using a standard multi flip-flop structure, are identified and marked. All such buses are candidate Gray-encoded read or write pointers. The multi flip-flop structure is used as the structure of the synchronizer seed. The marked busses are comparison domain crossings having different structures as depicted in FIG. 4.

Figure 4A:
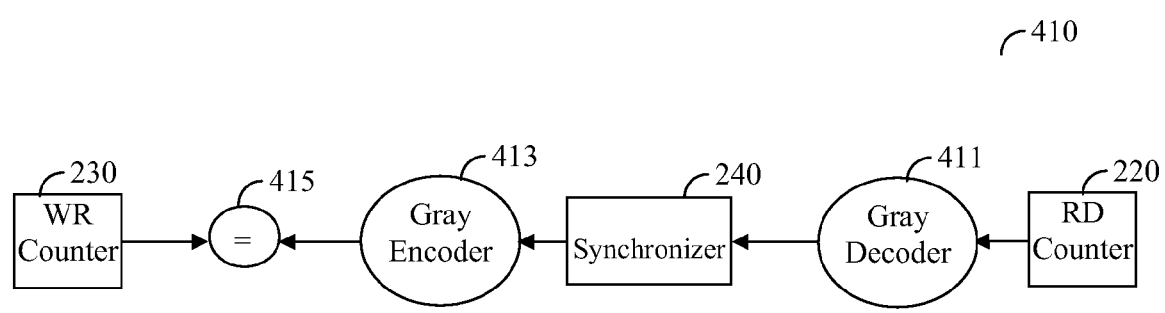
FIGS. 4A and 4B are schematically diagrams of comparison domain crossings.
Figure 4B:
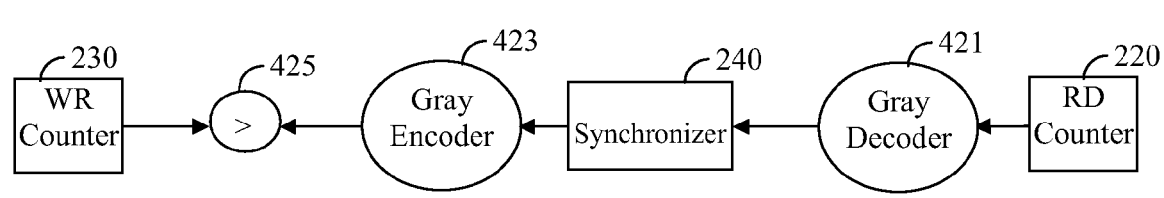

FIG. 4A shows comparison domain crossing 410 for generating the empty flag. A read counter 220 is followed by a Gray decoder 411 which coupled to synchronizer 240. The output of synchronizer 240 is connected to a Gray encoder 413 that its output is the first input of a bus equality check operator 415. The second input of operator 415 is a write counter 210. The Gray decoder and encoder 411 and 413 include only combinatorial logic. Operator 415 is part of a compare module 250. FIG. 4B shows comparison domain crossing 420 for generating the full flag. As can be noted the structure is similar, except that the bus equality check operator 415 is replaced by a greater-than (GT) operator 425.

Figure 5:
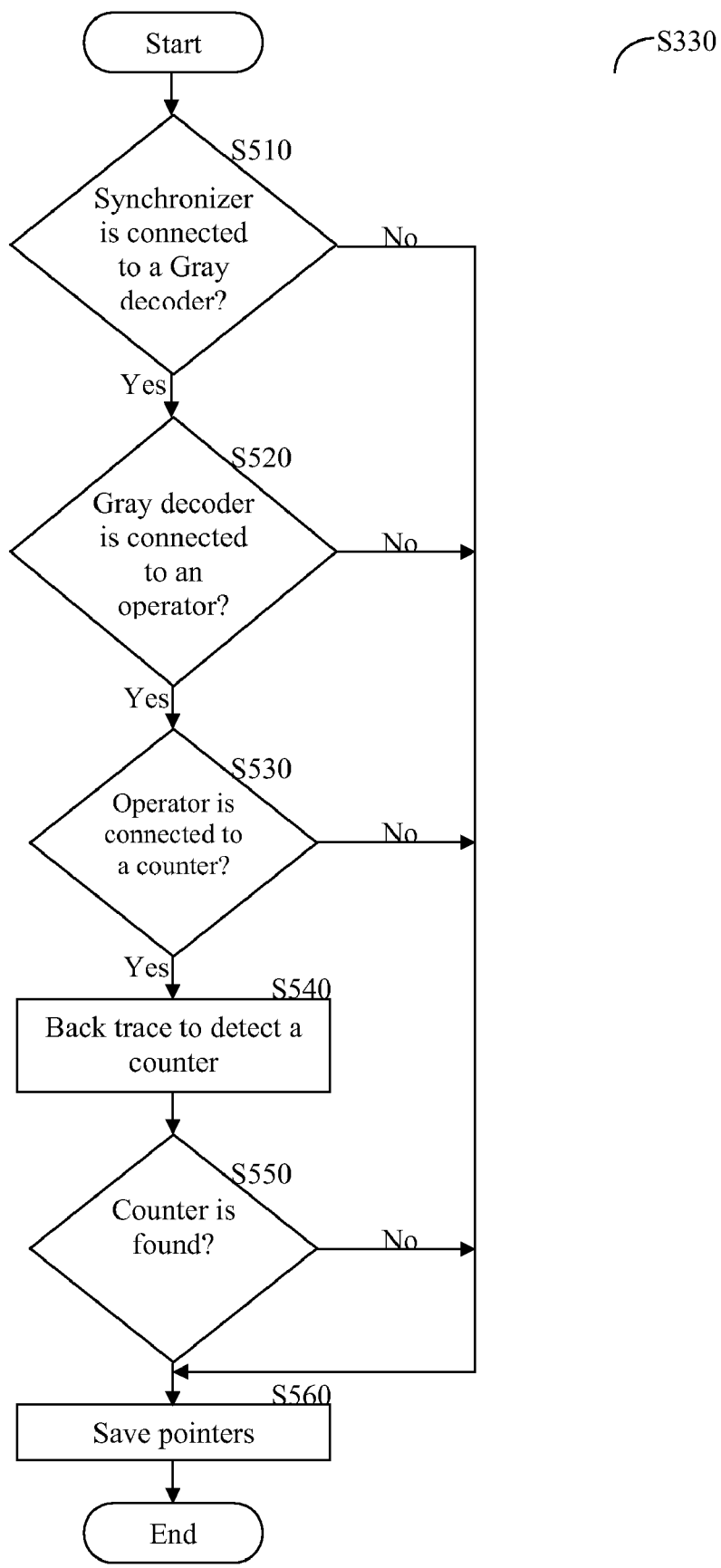
FIG. 5 is a flowchart describing the process for detecting read and write pointers by the synchronizer-seed based recognition process.

Returning to FIG. 3, at S320, one of the marked synchronized busses (i.e., a comparison domain crossing) is selected and unmarked. At S330, the method tries to recognize the read and write pointers by traversing from the identified synchronizer of the selected synchronized bus. FIG. 5 shows the execution of S330 in greater detail.

At S510, a check is made to determine if the output of identified synchronizer (e.g., synchronizer 240) is connected to combinatorial logic having functionality of a Gray decoder (e.g., decoder 413), and, if so, another check is made at S520 to determine if the output of the Gray decoder is followed by either an equality check operator 415 or a GT operator 425. If one of these operators is identified, then execution continues with S530 to determine if the second input of the identified operator is connected to a counter, and if so the encountered counter is the write counter. At S540, the method backtraces from the synchronizer through a Gray encoder (e.g., encoder 415) to detect a second counter.

At S550, it is determined if such counter is found, and if so the detected counter is the read counter. At S560, the read and write pointers of detected counters are saved and later utilized in the verification process. If one of steps S510, S520, S530 or S550 results with a negative answer, then the circuitry analyzed is determined not to be FIFO circuitry, and execution ends. It should be noted that the process described with reference to FIG. 5 recognizes read and write counters by traversing comparison domain crossings for generating the empty flag. However, the process can be easily adapted to traversing comparison domain crossings for generating the full flag (shown in FIG. 4B).

Referring back to FIG. 3, at S340 a check is made to determine if all the synchronized busses are unmarked (tested), i.e., if all comparison domain crossings were checked, and, if so, execution terminates. Otherwise, execution returns to S320. It will be understood by a person skilled in the art that a full FIFO recognition is achieved without identifying the FIFO memory.

Figure 6:
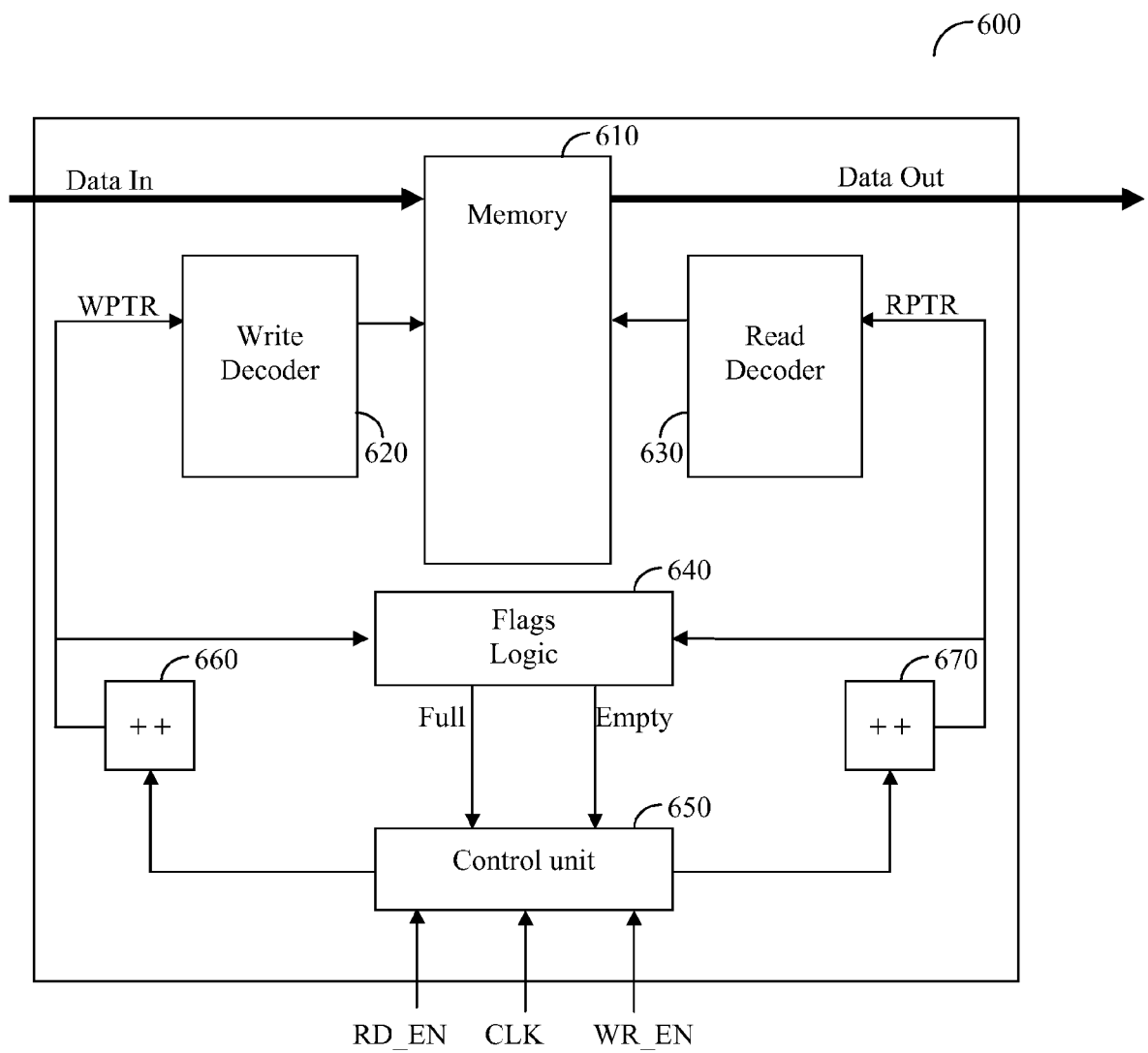
FIG. 6 is a diagram of a synchronous FIFO used for describing the principles of the memory-seed based FIFO recognition technique.

FIG. 6 shows an exemplary and non-limiting diagram of synchronous FIFO 600 used for describing the principles of the memory-seed based FIFO recognition technique or approach. FIFO 600 comprises a FIFO memory 610, a write decoder 620, a read decoder 630, flags logic 640, a control unit 650, a write increment operator 660, and a read increment operator 670. Memory element 610 may be a random access memory (RAM) in which reading and writing of data may be performed simultaneously and comprises a capacity of N words. When a read enable signal (RD_EN) is asserted, data is read from an address designated by a read address (RD_ADR) at a clock timing of a clock signal (CLK). The read address is designated by read decoder 630 based on the read pointer (RPTR). Data from FIFO memory 610 is read into the Data Out bus. Similarly, while a write enable signal (WR_EN) is asserted, data on the data out bus is written into an address designated by a write address (WR_ADR) at a clock timing of the clock signal CLK. The write address is designated by the write decoder 620 based on the write pointer (WPRT). The read pointer is incremented, by read increment operator 670, after every read made to memory unit 610. Write and read decoders 620 and 630 include at least multiplexers (MUXes), where select signals of these MUXs are the write and read pointers. Flags logic 640 generates status flags to indicate the state of FIFO memory element 610.

Figure 7:
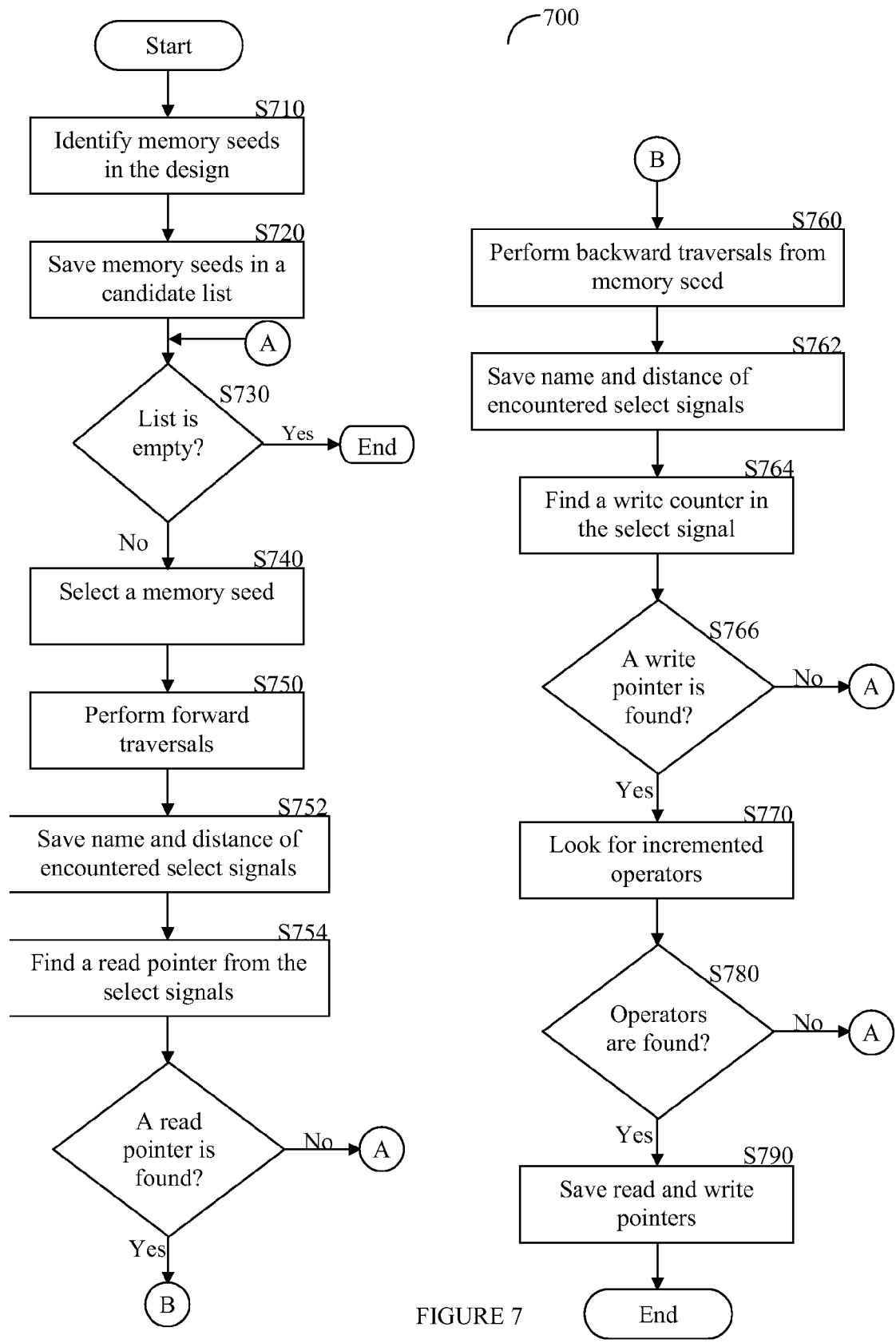
FIG. 7 is a flowchart describing the method for memory-seed based recognition in accordance with an exemplary embodiment of the present invention.

FIG. 7 shows an exemplary and non-limiting flowchart describing the method for memory-seed based recognition in accordance with one exemplary embodiment of the present invention. The recognition process starts with FIFO memory 610 and traces the logic forward and backward to detect the read and write pointers. At S710, a search is made to detect all structures of at least two rows of multi-bit registers in the design. Each such identified structure is considered as a memory-seed. At S720, all the memory-seeds are saved in a candidate list. At S730, a check is made if the list is empty, and if so, execution ends; otherwise, proceeding to S740 where a single memory seed is selected and removed from the list.

At S750, in order to detect the read pointer, forward traversals are performed starting from the output of the memory registers of the selected seed. At each traversal the method looks for the select signals of MUXes in read decoder 630. At S752, for each encountered select signal, its name and distance from the memory seed are saved in a candidate read pointer list (hereinafter the "RPTR list"). The distance to the select signal is the minimum number of gates or RTL expressions on the shortest path between the memory's register and the MUX. The select signals that are encountered in the traversals are the candidates for the read pointer. At S754, upon completing the forward traversals, all internal signals are removed from the RPTR list and the select signal having the minimum distance is detected. This select signal is a read pointer. At S756, a check is made to determine if a read pointer is recognized. If so execution continues with S760; otherwise, returning to S730.

At S760, an attempt is made to detect the write pointer by performing backward traversals from the enable signal of the memory's registers of the selected seed. At each traversal the method looks for the select signals of MUXes in the write decoder 620. At S762, for each encountered select signal its name and distance from the memory-seed are saved in a candidate write pointer list (hereinafter the "WPTR list"). The select signals that are encountered in every traversal are the candidates for the write pointer. At S764, upon completing the backward traversals, all internal signals and signals having different width than the recognized read pointer are removed from the WPTR list. In addition, the select signal that has the minimum distance is detected. This select signal is a write pointer. At S766 a check is made to determine if a write pointer is recognized. If so execution continues with S770; otherwise, returning to S730. At S770, backward traversals are performed from the read and write pointers to look for increment operators 660 and 670. At S780, it is checked if both operators 660 and 670 are identified, and if so the circuitry around the selected memory seed is declared as a FIFO and, at S790, the recognized read and write pointers are saved; otherwise, execution returns to S730. It would be appreciated by a person skilled in the art that the memory-seed based recognition described herein can be easily adapted to identify a synchronous FIFO structure.

The present invention can also recognize FIFOs in the design using counter-seed based detection. The counter-seed based recognition starts with increment operators that are potential counters of the read and write pointers of a FIFO. Subsequently, the recognition process traces back from the increment operators, until encountering a memory unit 610 or control unit 650. Recognition of FIFO is declared if the read and write pointers or the empty and full flags are identified.

In accordance with an exemplary embodiment of the present invention the methods described herein can be utilized to perform FIFO recognition at the RTL level of the design.

In accordance with an exemplary embodiment of the present invention the recognized FIFOs are verified to ensure that an empty FIFO is never accessed to read data from and that a full FIFO is never accessed to write data into. Specifically, the FIFO internal circuitry is verified to ensure that the empty and full flags are properly generated. In accordance with this exemplary embodiment, the verification is performed by generating and inserting a monitor circuit into the design. The monitor would report an error if a read operation is requested on an empty FIFO or a write operation is requested into a full FIFO. The monitor uses only the read and write pointers to check the functionality of the FIFO. This provides an advantage over prior art approaches that requires the identification of the full and empty flags in order to verify a FIFO.

The foregoing description of the embodiments is not intended to limit the invention to the particular details of the examples illustrated. Any suitable modification and equivalents may be resorted to the scope of the invention. All features and advantages of the invention that fall within the scope of the invention are covered by the appended claims The method of the invention may be applied to any type of computer, including but not limited to general purpose computers, special purpose computers or computers that utilize Applied Specific Integrated Circuit (ASIC) technology.

The invention may also be applied to any computer program product or any computer readable medium.

What is claimed is:

1. A method for recognizing first-in-first-out (FIFO) structures in integrated circuit (IC) designs, comprising:
    identifying at least one seed in an IC design that indicates the existence of a FIFO structure; and
    checking locally to the identified at least one seed the existence of the FIFO structure in the IC design;
    wherein the seed is a logic element included in the FIFO structure;
    wherein the seed comprises at least one of: a memory unit, a synchronizer, an equal operator, a less-than (LT) operator, a less-than-or-equal (LTE) operator, a greater-than (GT) operator, a greater-than-or-equal (GTE) operator, or incremental operators of read and write counters;
    wherein the memory-seed based recognition comprises:
    identifying all memory units in the IC design, and
    for each identified memory unit,
    traversing forward from the memory until encountering a read pointer;
    traversing backward from the memory until encountering a write pointer; and
    traversing from the read pointer and the write pointer until encountering increment operators; and
    wherein the step of traversing forward further comprises:
    searching for select signals of multiplexers (MUXes) in a read decoder connected to the memory unit; and
        determining the select signal that is not an internal signal and having minimum distance from the memory unit to its MUX to be the read pointer; and /or wherein the step of traversing backward further comprises:
    searching for select signals of MUXes in a write decoder connected to the memory unit; and
    determining the select signal that is not an internal signal and having minimum distance from the memory unit to its MUX to be the write pointer.

2. The method of claim 1, further comprising:
    verifying the identified FIFO structure to ensure proper FIFO flag generation.

3. The method of claim 1, wherein recognizing the entire FIFO structure comprises detecting at least a read pointer and a write pointer.

4. The method of claim 1, wherein the FIFO structure Includes; a synchronous FIFO or an asynchronous FIFO.

5. The method of claim 1, wherein the synchronizer-seed based recognition comprises:
    identifying all synchronizer logic elements in the IC design, and
    for each identified synchronizer logic element,
    tracing forward from the synchronizer until encountering Gray decoder;
    tracing forward from the Gray decoder until encountering a write counter;
    tracing backward from the synchronizer until encountering Gray encoder; and
    tracing backward from the Gray decoder until encountering a read counter.

6. The method of claim 5, wherein identifying the synchronizer logic element comprises identifying an address bus synchronized using a standard multi flip-flop structure.

7. The method of claim 1, wherein locally exploring the design is by using simulation.

8. The method of claim 1, wherein the identified FIFO structure is verified by:
    generating a monitor circuit that checks the functionality of the FIFO structure using read and write pointers;
    inserting the monitor circuit to the design; and
    generating an error report by the monitor circuit error if a read operation is requested on an empty FIFO or a write operation is requested into a full FIFO.

9. A computer storage device storing a computer program for execution by a computer processor for use by a computer to perform operations for verifying unstable clock-domain crossings in integrated circuit (IC) designs, comprising:
    identifying at least one seed in an IC design that indicates the existence of a FIFO Structure; and
    checking locally to the identified at least one seed the existence of the FIFO structure in the IC design,
    wherein the seed comprises at least one of: a memory unit, a synchronizer, an equal operator, a less-than (LT) operator, a less-than-or-equal (LTE) operator, a greater-than (GT) operator, a greater-than-or-equal (GTE) operator, or incremental operators of read and write counters;
    wherein the memory-seed based recognition comprises:
    identifying all memory units in the IC design; and
    for each identified memory unit;
    traversing forward from the memory until encountering a read pointer;
    traversing backward from the memory until encountering a write pointer, and
    traversing from the read pointer and the write pointer until encountering incremental operators, and
    wherein the step of traversing forward further comprises:
    searching for select signals of multiplexers (MUXes) in a read decoder connected to the memory unit; and
        determining the select signal that is not an internal signal and having minimum distance from the memory unit to its MUX to be the read pointer, and/or wherein the step of traversing backward further comprises:
    searching for select signals of MUXes in a write decoder connected to the memory unit; and
    determining the select signal that is not an internal signal and having minimum distance from the memory unit to its MUX to be the write pointer.

10. The computer storage device of claim 9, wherein the operations further comprise:
    verifying the identified FIFO structure to ensure that empty and full FIFO flags are properly generated.

11. The computer storage device of claim 10, wherein the seed is a logic element included in a FIFO structure.

12. The computer storage device of claim 9, wherein recognizing the entire FIFO structure comprises detecting a read pointer and a write pointer of the FIFO structure.

13. The computer storage device of claim 9, wherein the FIFO structure is one of a synchronous FIFO and an asynchronous FIFO.

14. The computer storage device of claim 9, wherein the synchronizer-seed based recognition comprises:
    identifying all synchronizer logic elements in the IC design; and
    for each identified synchronizer logic element:
    tracing forward from the synchronizer until encountering Gray decoder;
    tracing forward from the Gray decoder until encountering a write counter;

tracing backward from the synchronizer until encountering Gray encoder; and
tracing backward from the Gray decoder until encountering a read counter.

15. The computer storage device of claim 14, wherein identifying the synchronizer logic element comprises identifying an address bus synchronized using a multi flip-flop structure.

16. The computer storage device of claim 9, wherein locally exploring the design comprises simulation.

17. The computer storage device of claim 9, wherein verifying the identified FIFO structure further comprises:
generating a monitor circuit that checks the functionality of the FIFO structure using read and write pointers;
inserting the monitor circuit to the design; and
generating an error report by the monitor circuit error if a read operation is requested on an empty FIFO or a write operation is requested into a full FIFO.

* * * * *